United States Patent [19]
Kawaguchi

[11] Patent Number: 5,897,360
[45] Date of Patent: Apr. 27, 1999

[54] MANUFACTURING METHOD OF SEMICONDUCTOR INTEGRATED CIRCUIT

[75] Inventor: Hiroshi Kawaguchi, Tokyo, Japan

[73] Assignee: NEC Corporation, Tokyo, Japan

[21] Appl. No.: 08/953,240

[22] Filed: Oct. 17, 1997

[30] Foreign Application Priority Data

Oct. 21, 1996 [JP] Japan ................................... 8-277753

[51] Int. Cl.$^6$ ................................................ H01L 21/76
[52] U.S. Cl. ........................ 438/431; 438/424; 438/430; 438/429; 148/DIG. 50
[58] Field of Search .................................. 438/424, 429, 438/430, 431; 148/DIG. 50

[56] References Cited

U.S. PATENT DOCUMENTS 4,842,675  6/1989  Chapman ......................... 148/DIG. 50
5,496,765  3/1996  Schwalke ............................. 438/431

FOREIGN PATENT DOCUMENTS 57-167652  10/1982  Japan .
58-44735   3/1983   Japan .
63-2371    1/1988   Japan .
7-106413   4/1995   Japan .
8-279552   10/1996  Japan .

Primary Examiner—Trung Dang
Attorney, Agent, or Firm—Young & Thompson

[57] ABSTRACT

A manufacturing method of a semiconductor integrated circuit utilizing a trench isolated region to control the occurrence of parasitic transistors without narrowing the element region by forming first and second openings 4A, 4B on a silicon substrate for the purpose of element isolation, forming an amorphous silicon film thereon, then leaving the amorphous silicon film behind only a surface of a side wall of the opening by performing anisotropy etching. After oxidizing the surface of the amorphous silicon film and inside base, the opening is filled with a silicon oxide film.

6 Claims, 4 Drawing Sheets

MANUFACTURING METHOD OF SEMICONDUCTOR INTEGRATED CIRCUIT

BACKGROUND OF THE INVENTION

The present invention relates to a manufacturing method of a semiconductor integrated circuit. More to particularly, this invention relates to a method of forming a trench isolated region in the manufacturing method of the semiconductor integrated circuit.

DESCRIPTION OF THE PRIOR ART

A trench isolation method in the manufacturing method of the semiconductor is often used for element isolation with the high integration of the semiconductor device. A forming method of trench isolated region which is formerly used therefor is explained referring to FIG. 1. This forming method of the trench isolated region became well known because of the Japanese Patent Application Laid-Open No. SHO 63-2371 and so forth.

As shown in FIG. 1(a) which refers to the Japanese Patent Application Laid-Open No. SHO 63-2371, it causes silicon oxide film 12A to grow of 20 nm thick on a silicon substrate 1 within steam atmosphere of 900° C., further, it causes silicon nitride film to grow of 50 nm thick by chemical vapor-phase growth method, and it causes the first and the second openings 4A, 4B to provide of 300 nm depth by using the photo-lithography process and the following etching process. With respect to the openings, for example, the width of the first opening 4A is 0.2 µm, the width of the second opening 4B is 1 µm.

Subsequently, as shown in FIG. 1(b), in the conventional manufacturing method of the semiconductor integrated circuit, it causes the silicon oxide film 12B to grow of 120 nm thick within steam atmosphere of 1000° C. to fill the first opening 4A with the silicon oxide film 12B, further it causes silicon oxide film 12C to grow of 600 nm thick within atmosphere of $SiH_4$, $O_2$, Ar under 4 mTorr pressure, and temperature of 400° C., by the bias chemical vapor deposition method (CVD method), sufficiently to fill the second opening section 4B therewith.

Subsequently, as shown in FIG. 1(c) of the conventional manufacturing method of the semiconductor integrated circuit, it causes the silicon oxide film 12C to be removed by a chemical mechanical grinding method to flatten, further removing the silicon nitride film 13 by heated phosphoric acid of 150° C. Next, it causes p⁻ type channel region 16 to form using an ion implantation method to introduce boron of $5 \times 10^{12}/cm^2$ with 30 keV. Next, it causes the silicon oxide film 12A to remove by hydrogen oxide buffer solution with ratio of 1:30, before it causes a gate oxide film 17 to form of film of 5 nm thick within oxygen atmosphere of 900° C.

Subsequently, as shown in FIG. 1(d) of the conventional manufacturing method of the semiconductor integrated circuit, by using the Low Pressure Chemical Vapor Deposition method (CPCVD-method), it causes a polycrystal silicon film 19 to accumulate within mixed atmosphere of $SiH_4$, He, at the temperature of 650° C., and under the pressure of 0.6 Torr, before it causes a first and a second openings 4A, 4B to be subjected to pattern generation by photo-lithography process and following etching process. Next, ion implantation method causes arsenic to introduce with $1 \times 10^{15}/cm^2$ at 50 keV. Further, it causes the arsenic to be subjected to annealing within nitride atmosphere for 10 seconds at the temperature of 1000° C. to form n⁺ region 18. The polycrystal silicon film 19 which is not removed by the etching process becomes a mask, so that the region therebelow does not become an n⁺ region, but the region of the lower part rests thereon as a channel region 16.

Subsequently, the conventional manufacturing method of the semiconductor integrated circuit causes a layer insulation film 10 made of oxidized film to form over the whole surface, before forming an Al electrode 11 connected to the polycrystal silicon film 19. A part of the oxidized film shown by ΔW within FIG. 1(d) is thicker than a gate oxidized film 17. This is a reason why it causes an extent to possess at upper end of the opening by oxidization process.

Suppose there never exist the extent, when it causes positive gate electric potential to apply to the polycrystal silicon film 19 which becomes a gate electrode, there occurs electrostatic concentration at the gate oxidized film neighboring the upper end of the opening. Thereby, threshold electric potential decreases practically at only portion thereof. For this reason, when it causes the device to operate, entirely, there appears also a simultaneously operating parasitic transistor whose threshold voltage is low. This phenomena is not desired because it produces an increment of leakage current at stand by.

In the prior art example, the region of ΔW can be regarded as the region where the gate oxidized film becomes thick in the upper end of the opening in which electrostatic concentration is easy to occur. The electric field is approximately counter proportional to film thickness of the oxidized film thereby in the prior art example, the electrostatic concentration is controlled, and the operation of parasitic transistor is controlled accordingly. However, although the region of ΔW does not operate as a parasitic transistor, original device operation is not desired. Originally, although the whole width W of the element region shown in FIG. 1(d) should contribute to the device operation, in the prior art example, the region of 2×ΔW does not contribute to the operation.

Thus, the trench isolated region forms by the conventional method, a portion with the extent at upper end of the opening is formed at out side of the opening, and thereby, there is the problem that the device activated region narrows down by the portion corresponding to the extent. According to numerical simulation implemented by the inventor, as shown in FIG. 2, if ΔW is more than 10 nm, a leakage current at the time of stand by becomes constant, thus the effect of the parasitic transistor is controlled. Consequently, at the lowest ΔW value, the element activated region narrows by 20 nm. When the device operates under the condition that the width W of the element region is 200 nm, 20 nm becomes deterioration of 10% of the device's current driving capability. Inversely, it might be proper that there is designed as the width W to be 220 nm in anticipation of deterioration of current driving capability. In order to design without lowering integration of the element, it should cause the least width of the opening to narrow down by 20 nm.

In FIG. 1(a), F shows the narrow width of the first opening 4A, and W shows the width of the element region. In the ordinary CMOS integrated circuit, both F and W are adopted as various values on account of circumstances of circuit layout. F is limited by the limit of technology of photo-lithography. A value lower than the limit of technology of photo-lithography can not be used. When minimum limit value of the photo-lithography as value of F, is used for increasing the integration as much as possible, increasing of adjacent value of W causes the value of F to become lower than the minimum limit value. Consequently, when it causes W to enlarge for compensating the current driving capability, limit value of the photo-lithography becomes incapable of being used as the minimum value of F. The minimum value thereof comes into limited value+2×ΔW, with the result that the integration of the semiconductor is lowered.

SUMMARY OF THE INVENTION

In view of the foregoing, it is an object of the present invention to provide a manufacturing method of a semiconductor integrated circuit which is capable of controlling the occurrence of a parasitic transistor without narrowing down element regions.

According to one aspect of the present invention, for achieving the above-mentioned object, there is provided a manufacturing method of a semiconductor integrated circuit which comprises the steps of forming a first silicon oxide film and a silicon nitride film on one main surface of a semiconductor substrate in order, forming an opening for use in element isolation by causing the silicon nitride film, the first silicon oxide film, and the semiconductor substrate to be subjected to anisotropy etching, leaving amorphous silicon film only on a side wall of the opening by causing amorphous silicon film to form on the whole surface thereof to be subjected to the anisotropy etching, forming a second silicon oxide film on the surface of the amorphous silicon film of the side wall and on the inside base of the opening to be exposed to oxidized atmosphere, filling the opening by forming a third silicon oxide film at a whole surface thereof including the surface of the second silicon oxide film, exposing the surface of the silicon nitride film by removing the third silicon oxide film using either anisotropic etching method or grinding method, and removing exposed the silicon nitride film.

According to another aspect of the present invention, there is provided a manufacturing method of a semiconductor integrated circuit which comprises the steps of forming a first silicon oxide film and a silicon nitride film on one main surface of a semiconductor substrate in order, forming an opening for use in element isolation by causing the silicon nitride film, the first silicon oxide film, and the semiconductor substrate to be subjected to anisotropy etching, forming selectively silicon film on exposed surface of silicon of the opening, forming a second silicon oxide film causing surface of the silicon film to be exposed to oxidized atmosphere to oxidize, filling the opening by forming a third silicon oxide film at a whole surface thereof including the surface of the second silicon oxide film, exposing the surface of the silicon nitride film by removing the third silicon oxide film using either anisotropic etching method or grinding method, and removing exposed the silicon nitride film.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

Figure 1A:
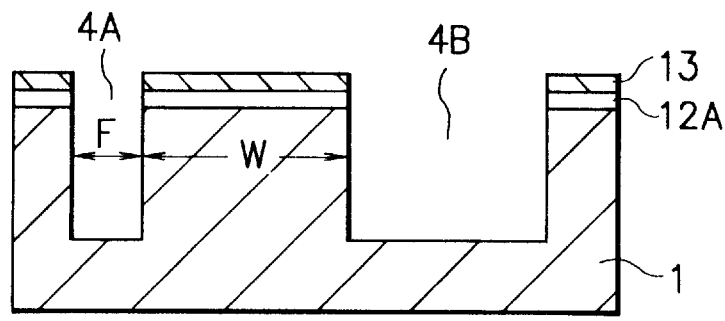
FIGS. 1(*a*) to 1(*d*) are sectional views showing a semiconductor chip for explaining conventional example.
Figure 1B:
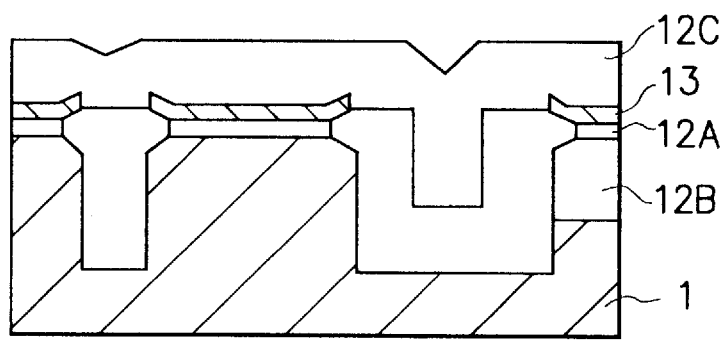
Figure 1C:
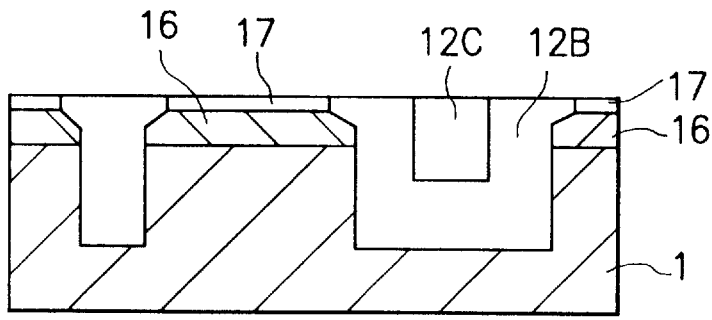
Figure 1D:
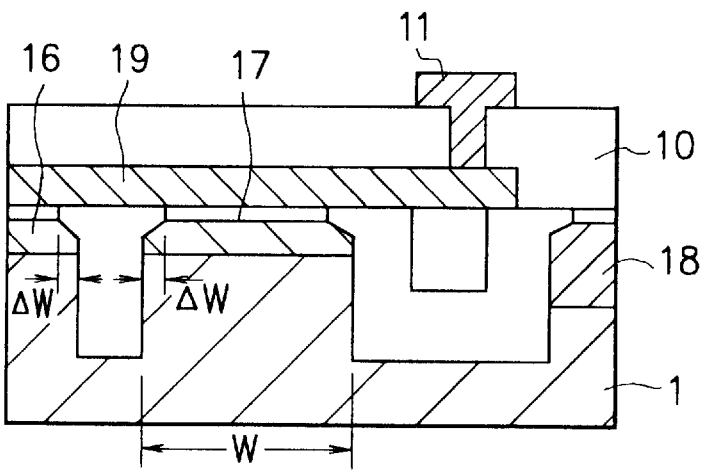
Figure 2:
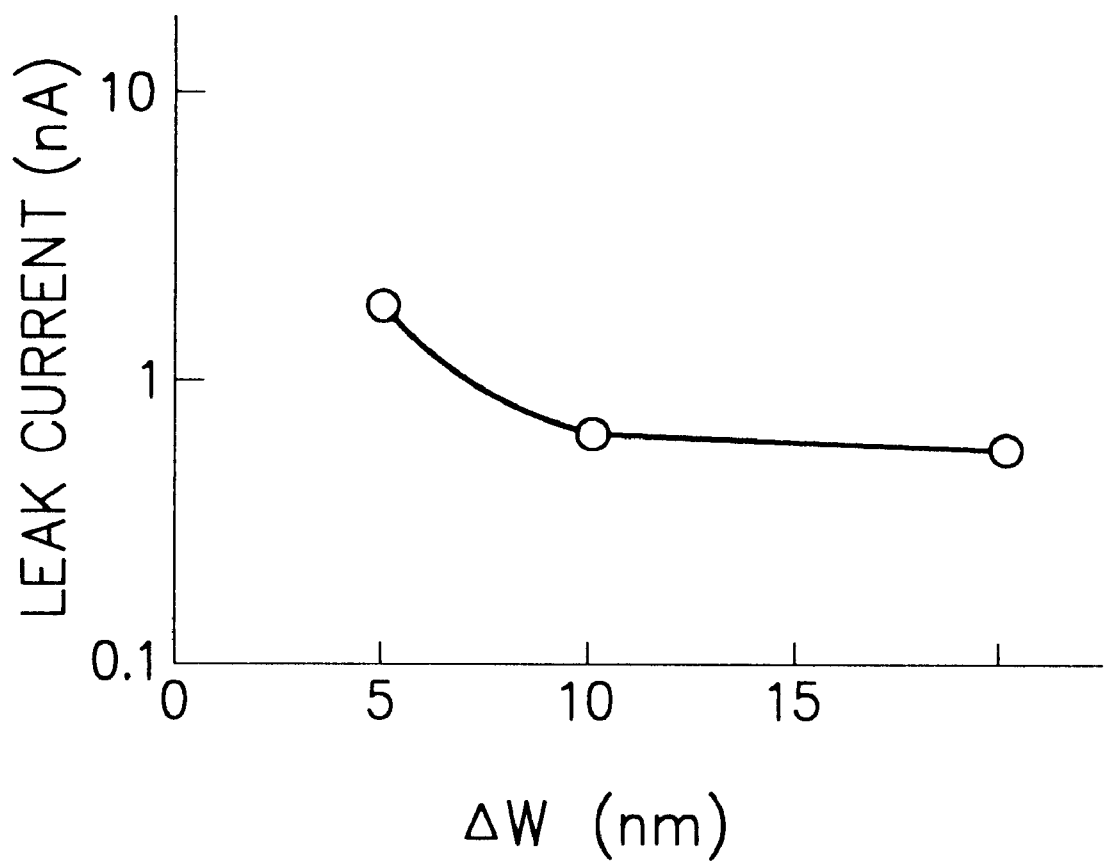
FIG. 2 is a view showing relationship between ΔW and leakage current.

A preferred embodiment of the present invention will now be described in detail referring to the accompanying drawings. FIGS. 3(*a*) to 3(*d*) are sectional views of a semiconductor chip for explaining a first embodiment according to the present invention.

Firstly, as shown in FIG. 3(*a*), a manufacturing method of a semiconductor integrated circuit causes a first silicon oxide film 2A to grow of 20 nm thick on a silicon substrate 1 within a steam atmosphere of 900° C. Further it causes a silicon nitride film to grow of 100 nm thick within atmosphere of $SiH_4$, $NH_3$ by Low Pressure Chemical Vapor Deposition Method (LPCVD-method), before it causes a first and a second openings 4A, 4B to be bored to 300 nm deep by photo-lithography process and a following etching process. One example of width of the first opening section 4A is 0.2 μm, and width of the second opening section 4B is 1 μm.

Subsequently, as shown in FIG. 3(*b*), the LPCVD-method is used. For example, the manufacturing method for the semiconductor integrated circuit causes an amorphous silicon film 5 to accumulate with film thickness of the order of 40 nm at a temperature of 500° C., and under a pressure of 0.4 Torr within an atmosphere of $Si_2H_6$, He. The film thickness of the amorphous silicon film is 10 to 50 nm. The film with less than 10 nm is difficult to be created controllably. While, in cases where the film is more than 50 nm thick, when the width of the first opening 4A is 200 nm, the width of the opening becomes less than 100 nm after formation of the amorphous silicon film and the oxidation of surface thereof. It becomes difficult to accumulate an oxidized film at the opening with 100 nm wide at the later process, thus deteriorating an isolation property of element. Next, it causes an etch-back to implement using $Cl_2$-gas so as to remain the amorphous silicon film 5 at only side wall section of the opening. It causes the time of the etch-back to adjust so that height of the upper end of the amorphous silicon film 5 which remains at this time agrees with the upper end of the silicon substrate 1. The upper end configuration of the amorphous silicon film 5 on the side wall becomes an acute angle shape.

Subsequently, as shown in FIG. 3(*c*), the manufacturing method of the semiconductor integrated circuit causes the surface of the amorphous silicon film 5 and the bottom surface of the opening which remain on the side wall of the opening to oxidize within the steam atmosphere of 900° C. to form a second silicon oxide film 2B 30 nm thick. At the time of oxidation, a portion of the amorphous silicon film 5 which is not oxidized is crystallized to be assimilated with the silicon substrate 1. At this time, since the extent of the upper end of the opening is formed on the inside of the opening not on the outside, thus causing device activated (element) region not to be narrowed down.

With respect to the upper part of the opening, the amorphous silicon film 5 which becomes the acute angle in the etch-back process is oxidized thereby, the configuration becomes extended configuration at the upper end of the opening. There never occurs the effect of parasitic transistor after device formation. The extended region is equivalent to thickness of accumulated film of the amorphous silicon film 5 namely it becomes film thickness of order of 40 nm in this embodiment. Next, it causes a third silicon oxide film 2C to accumulate to 600 nm thick to fill the opening therewith at the temperature of 400° C. and under the pressure of 4 mTorr within the atmosphere of $SiH_4$, $O_2$, Ar, before causing the silicon oxide 2C to flatten by chemical mechanical grinding method, thus causing surface of the silicon nitride film 3 to expose.

Figure 3A:
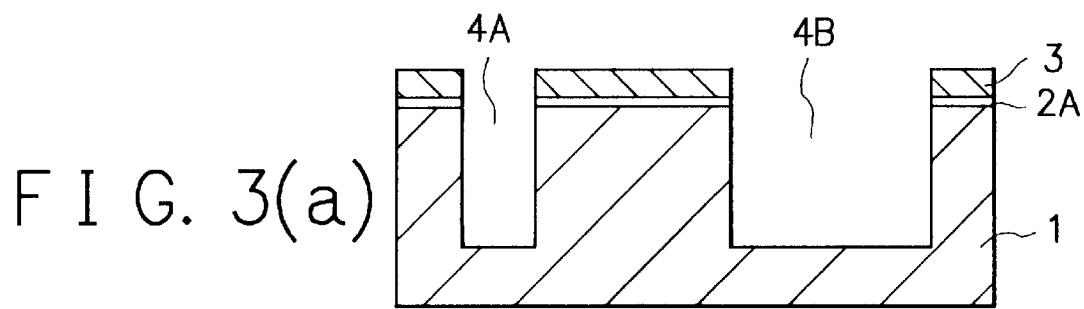
FIGS. 3(*a*) to 3(*d*) are sectional views showing a semiconductor chip for explaining a first embodiment according to the present invention.
Figure 3B:
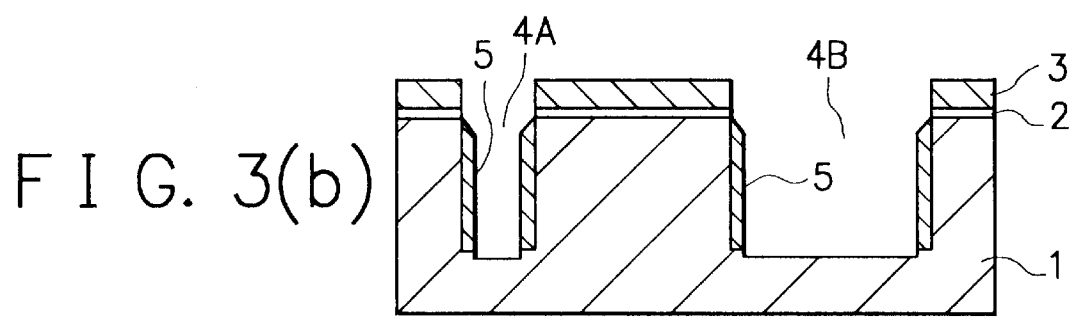
Figure 3C:
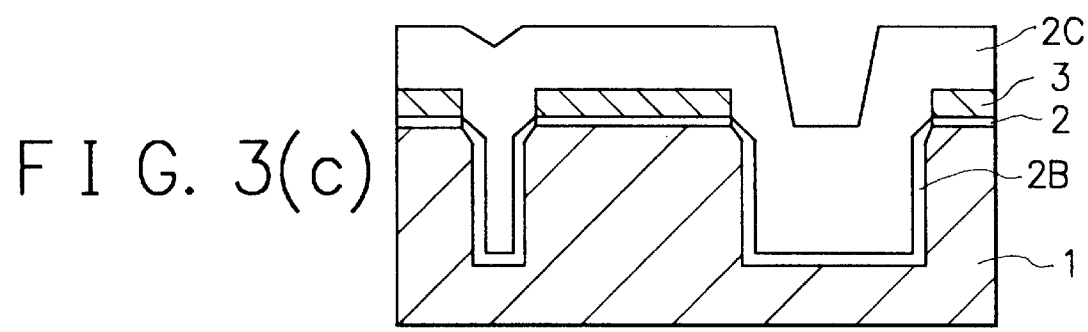
Figure 3D:
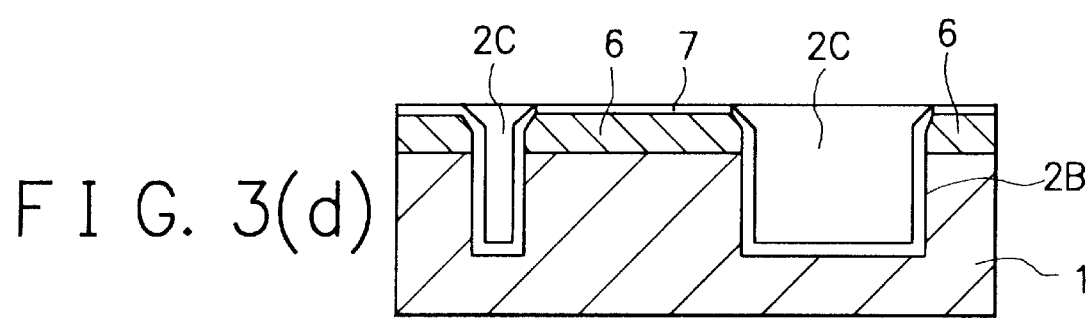

Subsequently, as shown in FIG. 3(d), the manufacturing method of the semiconductor integrated circuit causes the silicon nitride film 3 to remove by heated phosphoric acid with temperature of 150° C. It causes boron of $5 \times 10^{12}/cm^2$ to introduce at 30 keV to form p⁻ type channel region 6. Next, it causes the silicon oxide film 2A to remove by hydrogen oxide buffer solution with ratio of 1:30, before it causes a gate oxide film 7 of film of 5 nm thick to grow within oxygen atmosphere of 900° C.

Figure 4:
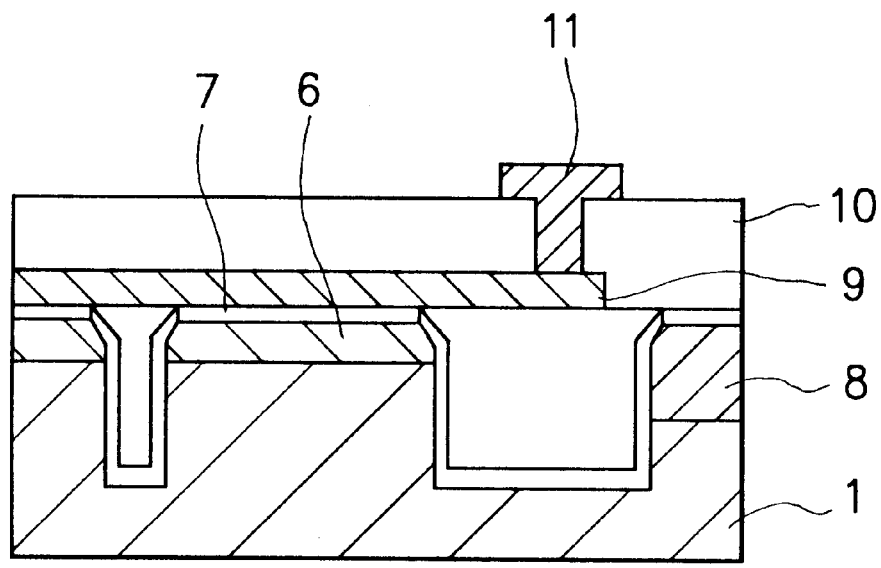
FIG. 4 is a sectional view showing a semiconductor chip for explaining the first embodiment according to the present invention.

Subsequently, in the same way as the prior art example, the manufacturing method of the semiconductor integrated circuit causes gate electrode 9, n⁺-region 8, interlayer isolation film 10, Al electrode 11 and so forth to form to accomplish the semiconductor device shown in FIG. 4.

Figure 5:
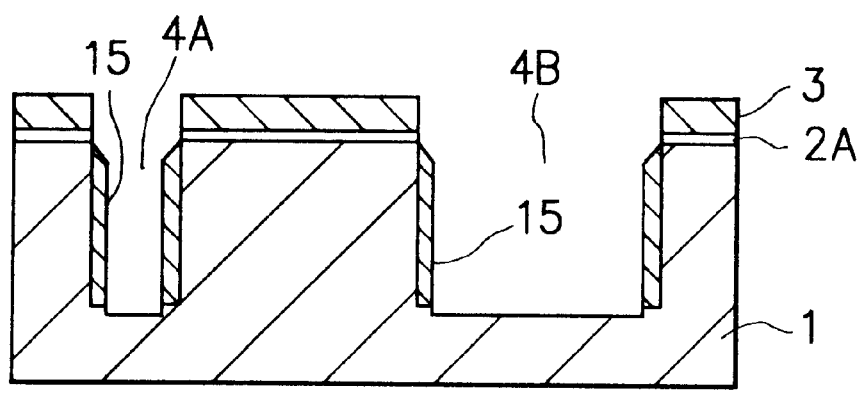
FIG. 5 is a sectional view showing a semiconductor chip for explaining a second embodiment according to the present invention.

FIG. 5 is a sectional view of a semiconductor chip for explaining a second embodiment of the present invention. In FIG. 5, a silicon film is used as substitute for the amorphous silicon film in the first embodiment. Hereinafter, the second embodiment is explained referring to FIG. 3 too.

Firstly, as shown in FIG. 5, the same operation as that of the first embodiment is implemented, namely the manufacturing method of the semiconductor integrated circuit causes a first silicon oxide film 2A to grow of 20 nm thick on a silicon substrate 1 within a steam atmosphere of 900° C. Further it causes a silicon nitride film 3 to grow of 100 nm thick within atmosphere of $SiH_4$, $NH_3$ by Low Pressure Chemical Vapor Deposition Method (LPCVD-method), before it causes a first and a second openings 4A, 4B to be bored 300 nm deep by photo-lithography and following by etching. One example width of the first opening 4A is 0.2 μm, and the second opening 4B is 1 μm.

Subsequently to the above operation, Ultra High Vacuum Chemical Vapor Deposition method (UHV-CVD method) is used. In the UHV-CVD method, for example it causes the silicon substrate 1 to heat at the temperature of 800° C., and under the pressure of order of 1 nTorr for three minutes, before it causes a silicon film 15 to accumulate selectively of about 40 nm thick at only exposed portion of the substrate on the inside of the opening at the temperature of 650° C., under the pressure of 0.2 mTorr, and within the atmosphere of $Si_2H_6$. It follows from the characteristic of the UHV-CVD method that configuration of upper end portion of the opening becomes configuration so called facet, with result that upper end of the aperture section becomes configuration with the extent. Next, it causes silicon oxide film to form of 30 nm thick at the surface of the silicon film 15 within steam atmosphere of 900° C. Next, the device is accomplished due to the same process as that of the first embodiment explained referring to FIGS. 3(c), 3(d) and FIG. 4.

According to the second embodiment, element region does not narrow down, and influence of the parasitic transistor does not occur. Further according to the second embodiment, since the silicon film is capable of forming selectively on the surface of the opening, the process becomes simple in comparison with the first embodiment in which it causes the amorphous silicon film to form to be subjected to the etch-back.

As described above according to the present invention, it causes amorphous silicon film or silicon film to provide for the surface within the opening for use in element isolation. Since the upper end portion of the element isolated region is capable of being broadened by the fact that it causes the amorphous silicon film or the silicon film to oxidize on the surface thereof, there is obtained the semiconductor integrated circuit in which generation of the parasitic transistor is controlled exception for the narrowing down the element region.

While preferred embodiments of the invention have been described using specific terms, such description is for illustrative purpose only, and it is to be understood that changes and variations may be made without departing from the spirit or scope of the following claims.

What is claimed is:

1. A manufacturing method of a semiconductor integrated circuit comprising the steps of:

forming a first silicon oxide film and a silicon nitride film on one main surface of a semiconductor substrate in order;

forming an opening for use in element isolation by causing said silicon nitride film, said first silicon oxide film, and said semiconductor substrate being subjected to anisotropic etching;

leaving amorphous silicon film contacting said semiconductor substrate only on a side wall of said opening by causing amorphous silicon film to be first formed on the whole surface of the opening and second to be subjected to the anisotropic etching;

forming a second silicon oxide film on the surface of said amorphous silicon film of said side wall and on the inside base of said opening to be exposed to oxidized atmosphere, said second silicon oxide film contacting said first silicon oxide film;

filling said opening section by forming a third silicon oxide film at a whole surface thereof including the surface of said second silicon oxide film;

exposing the surface of said silicon nitride film by removing said third silicon oxide film using either anisotropic etching or grinding; and removing exposed said silicon nitride film.

2. A manufacturing method of a semiconductor integrated circuit as claimed in claim 1, wherein the step of leaving amorphous film contacting said semiconductor side wall by subjecting the amorphous silicon film formed on the whole surface of the opening to anisotropic etching, further comprises the step of etching the amorphous silicon film so that an upper end of the amorphous silicon film agrees with a top edge of the silicon substrate.

3. A manufacturing method of a semiconductor integrated circuit as claimed in claim 1, wherein film thickness of said amorphous silicon film is approximately 10 to approximately 50 nm.

4. A manufacturing method of a semiconductor integrated circuit as claimed in claim 2, wherein film thickness of said amorphous silicon film is approximately 10 to approximately 50 nm.

5. A manufacturing method of a semiconductor integrated circuit comprising the steps of:

forming a first silicon oxide film and a silicon nitride film on one main surface of a semiconductor substrate in order;

forming an opening for use in element isolation by causing said silicon nitride film, said first silicon oxide film, and said semiconductor substrate to be subjected to anisotropy etching;

forming selectively a silicon film on exposed surface of a silicon of said opening;

forming a second silicon oxide film causing surface of said silicon film to be exposed to oxidized atmosphere to oxidize;

filling said opening by forming a third silicon oxide film at a whole surface thereof including the surface of said second silicon oxide film;

exposing the surface of said silicon nitride film by removing said third silicon oxide film using either an anisotropic etching method or a grinding method; and removing exposed said silicon nitride film.

6. A manufacturing method of a semiconductor integrated circuit as claimed in claim 5, wherein film thickness of said silicon film is approximately 10 to approximately 50 nm.

* * * * *